(12) United States Patent
Kasperkovitz

(10) Patent No.: US 6,798,218 B2
(45) Date of Patent: Sep. 28, 2004

(54) CIRCUIT FOR MEASURING ABSOLUTE SPREAD IN CAPACITORS IMPLEMENTED IN PLANARY TECHNOLOGY

(75) Inventor: Wolfdietrich Georg Kasperkovitz, Waalre (NL)

(73) Assignee: Semiconductor Ideas to Market (ITOM) B.V., Brada (NL)

( * ) Notice: Subject to any disclaimer, the term of this patent is extended or adjusted under 35 U.S.C. 154(b) by 11 days.

(21) Appl. No.: 10/296,292
(22) PCT Filed: May 16, 2001
(86) PCT No.: PCT/EP01/05617
§ 371 (c)(1), (2), (4) Date: Nov. 21, 2002
(87) PCT Pub. No.: WO01/90765
PCT Pub. Date: Nov. 29, 2001

(65) Prior Publication Data
US 2004/0090237 A1 May 13, 2004

(30) Foreign Application Priority Data
May 23, 2000 (EP) .............................. 00201821

(51) Int. Cl.⁷ ................................ G01R 27/26
(52) U.S. Cl. ............... 324/658; 324/676; 324/76.53; 324/76.55
(58) Field of Search ............... 324/658, 676, 324/679, 681, 683, 709, 710–712, 537, 765, 158.1, 76.52, 76.53, 76.55; 327/157, 536, 537

(56) References Cited
U.S. PATENT DOCUMENTS
5,563,779 A * 10/1996 Cave et al. ............... 363/59

FOREIGN PATENT DOCUMENTS
GB 2 184 621 A 12/1986

OTHER PUBLICATIONS

Roher, Dr. K.C.; "Measuring Capacitance", Elektor Electronics, Feb., 1996, Dorchester, G.B.; pp. 48–51.

Chen et al; "An On–Chip, Interconnect Capacitance Characterization Method with Sub–Femto–Farad Resolution", IEEE Ttransactions on Semiconductor Manufacturing, vol. 11, No. 2, May, 1998; pp. 204–210.

* cited by examiner

Primary Examiner—N. Le
Assistant Examiner—Vincent Q. Nguyen
(74) Attorney, Agent, or Firm—Robert M. McDermott, Esq.

(57) ABSTRACT

A circuit for measuring absolute spread in capacitors implemented in planary technology. A charge pump supplying a charge current to an internal capacitor (Cint) is used, the voltage across the internal capacitor (Cint) being coupled through a comparator for comparing the voltage with first and second threshold levels. A bistable multivibrator reverses the direction of the charge current, to charge the internal capacitor (Cint) when the voltage decreases below the second threshold level, and to decharge the internal capacitor (Cint) when the voltage increases above the first threshold level. The charge current is determined by a reference voltage that is provided across an external resistor (Rext), the first and second threshold levels defining a voltage range being proportional to the reference voltage. An output signal of the bistable multivibrator is coupled to frequency measuring means to compare the repetition frequency thereof with a reference frequency.

20 Claims, 3 Drawing Sheets

Figure 1:
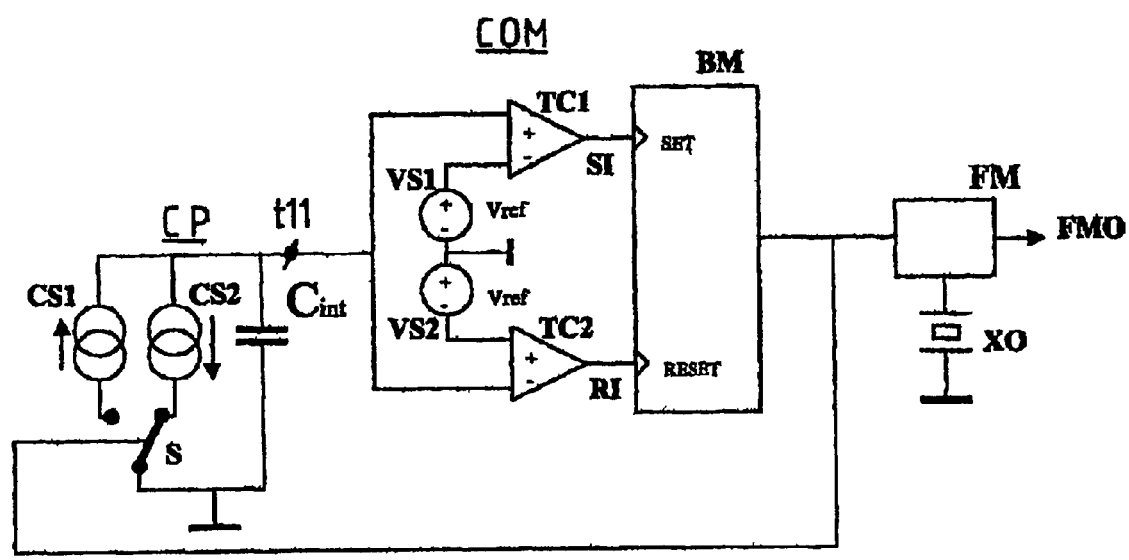

CIRCUIT FOR MEASURING ABSOLUTE SPREAD IN CAPACITORS IMPLEMENTED IN PLANARY TECHNOLOGY

The invention relates to a circuit for measuring absolute spread in capacitors implemented in planary technology. Planary technologies are to be understood to include integrated circuit (IC-), thick film, thin film and printed circuit board technologies. Such measuring circuits are on themselves known. An example thereof implemented in IC technology is e.g. disclosed in UK Patent Application GB 2 184 621.

The component values of circuit elements implemented in planary technology and in particular in integrated circuit (IC) technology are known to have absolute and relative spread. Absolute spread is understood to be the spread in the actual component values from a wanted average value, whereas relative spread is understood to be the spread in the component values relative to each other. Absolute spread is mainly caused by variation of the thickness or the composition of planar layers, whereas relative spread is caused by the inhomogenities along the X and Y axes of the planar layers. In practice the absolute spread in the component values of elements of a circuit implemented in planary technology, hereinafter indicated as "planary implemented circuit", is much larger than the relative spread in the component values of said elements.

The above known circuit is used for self-calibration of capacitances for a binarily weighted array of capacitances and provides for an interrupted measurement of the absolute spread. This feature excludes the application of the circuit for functions which require continuous operation, because during the calibration phase the array of capacitances has to be disconnected from the rest of the circuit. This in particular rules out the known circuit from being used in e.g. receivers.

It is an object of the present invention to provide a continuous and reliable measurement of absolute spread of integrated capacitors.

A circuit for measuring absolute spread in capacitors implemented in planary technology according to the invention is therefore characterised in that it comprises a charge pump supplying a charge current to an internal capacitor (Cint), the voltage across the internal capacitor (Cint) being coupled through a comparator for comparing said voltage with first and second threshold levels to a bistable multivibrator for reversing the direction of the charge current to charge the internal capacitor (Cint) when said voltage decreases below the second threshold level and to decharge the internal capacitor (Cint), when said voltage increases above the first threshold level, a reference voltage determining the charge current, as well as the voltage range between said first and second threshold levels, an output signal of the bistable multivibrator being coupled to frequency measuring means to compare the repetition frequency thereof with a reference frequency.

The invention is based on the recognition that due to the small relative spread of elements within a planary implemented circuit, a reliable indication for the absolute spread of any and all elements within such circuit is obtained by measuring the actual deviation of the value of only one element thereof from a precision reference value.

By applying the above measure of the invention, an internal capacitor (Cint) is being measured by using this capacitor as integrating element in an oscillator configuration. For a given Cint, the frequency of this oscillator is defined by the voltage range between the first and second threshold levels on the one hand and the charge/decharge current of the internal capacitor (Cint) on the other hand. By having both voltage range and charge/decharge current depend on the same, by internal circuit elements defined parameter, i.e. said reference voltage, the oscillation frequency of the circuit becomes independent from said parameter and varies only with the internal capacitor (Cint) and the external resistor (Rext). The less spread in the external resistor (Rext), the more accurate the oscillation frequency will vary with the absolute spread of the internal capacitor (Cint) only. Preferably a high precision resistor is used for the external resistor (Rext). To derive a measure for the absolute spread of the internal capacitor (Cint) from the oscillating frequency, frequency measuring means are used to compare the repetition frequency of the oscillating frequency with a reference frequency. Preferably a high precision crystal oscillator is used to generate the reference frequency.

A preferred embodiment of circuit according to the invention is characterised in that said voltage range is proportional to the reference voltage. This allows for a proper matching of circuit elements, therewith increasing the accuracy of the measurement.

Preferably such circuit is characterised in that the charge current is generated by the reference voltage being provided across an external resistor Rext. A discrete resistor can now be used, such discrete resistor normally having much less spread than planary implemented resistors. This allows to further increase the accury of the measurement.

Preferably such circuit is characterised by a monotonous variation of the voltage across said internal capacitor in the range between first and second threshold levels being defined by the quotient of the reference voltage and the internal capacitor (Cint), said range being defined by the magnitude of the reference voltage and said charge current being defined by the quotient of the reference voltage and the external resistor (Rext). This measure allows for proper element matching resulting in an immunity of the oscillation frequency from parameters, which are defined by internal elements. Another preferred embodiment of a circuit according to the invention is characterised by said internal capacitor (Cint) being coupled between emitters of first and second transistors, the collectors and the bases thereof being coupled through mutually equal load resistors to a first supply voltage, said collectors being coupled to inputs of a negative feedback circuit for a negative feedback of the collector output voltage of said first and second transistors to the base inputs thereof, the emitters of said first and second transistors being coupled to first and second outputs of said charge pump.

The invention will be described in greater detail with reference to Figures shown be way of example in the drawing.

Figure 2:
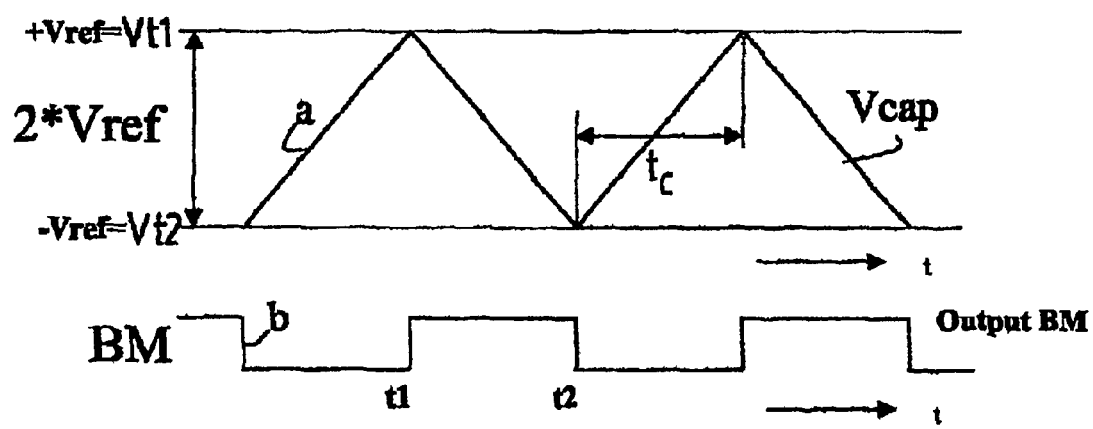
Figure 3:
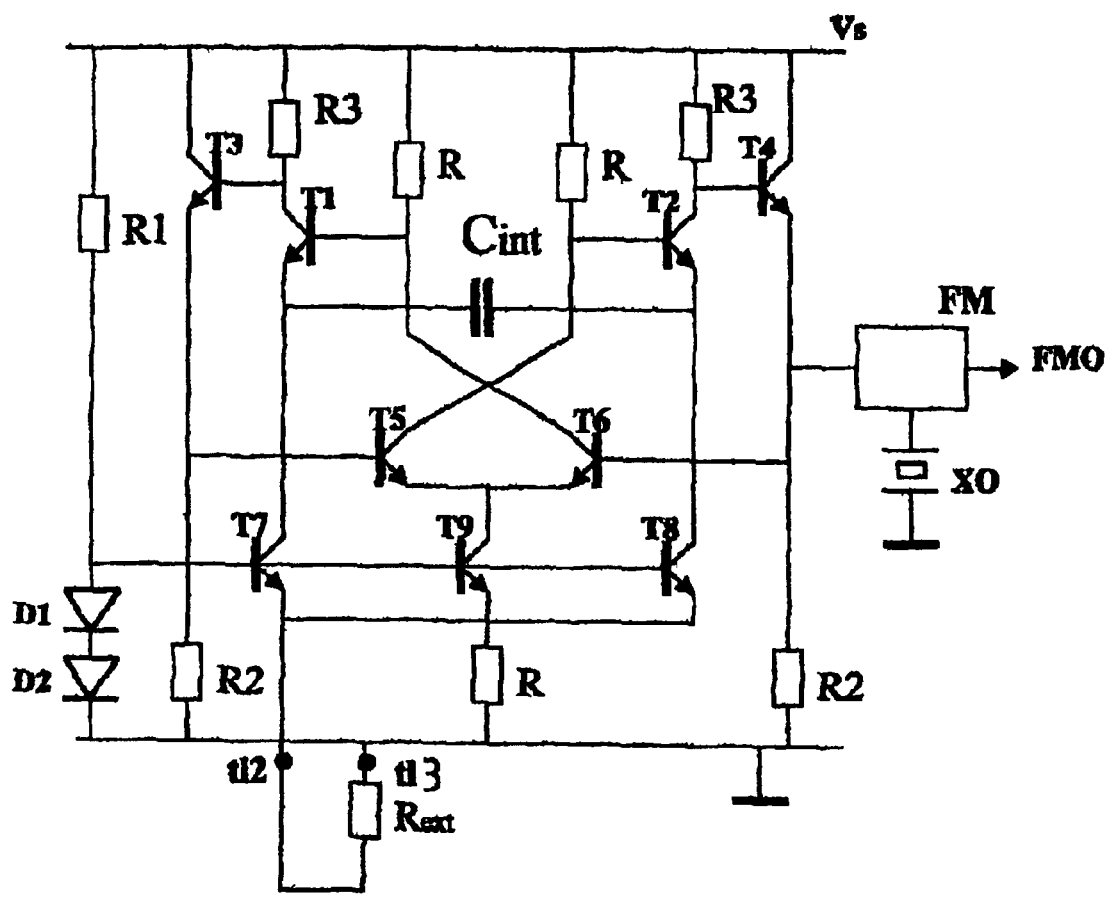

In this drawing it is shown in:

FIG. 1 a functional block diagram of the circuit for measuring absolute spread in capacitors implemented in planary technology according to the invention;

FIG. 2 a signal plot showing the voltage across the internal IC capacitor in the circuit of FIG. 1;

FIG. 3 a circuit diagram of a preferred embodiment of the circuit according to the invention.

FIG. 1 shows a circuit for measuring absolute spread in capacitors implemented in planary technology, hereinafter also referred to as planary implemented circuit, comprising a charge pump CP including first and second current sources CS1 and CS2 respectively, for supplying alternately charge and decharge currents of equal magnitude in mutually opposite direction to an internal capacitor (Cint) via a terminal tI1, the charge pump CP being provided with a controlled switching device S for alternately coupling the first and the second current source CS1 and CS2, respectively, through a mass connection across the internal capacitor Cint. The voltage across the internal capacitor (Cint) at the terminal tI1, hereinafter referred to as capacitor voltage Vcap, is being coupled to first and second threshold circuits TC1 and TC2 of a comparator COM for comparing said voltage with first and second threshold levels Vt1 and Vt2, respectively. In the circuit shown the first and second threshold levels Vt1 and Vt2 are chosen at +Vref and −Vref, respectively. Outputs of the first and second threshold circuits TC1 and TC2 are coupled to set and reset inputs SI and RI of a bistable multivibrator BM, respectively. An output of the bistable multivibrator BM is coupled to a control input of the switching device S.

The operation of the planary implemented circuit will be described in more detail with reference to FIG. 2, showing respectively in curve a the time dependent variation of the capacitor voltage Vcap and in curve b the binary output signal of the bistable multivibrator BM being supplied as switching control signal to the controlled switching device S.

In a first state of the controlled switching device S the first current source CS1 is coupled to the internal capacitor (Cint), supplying thereto a charge current I. This causes the capacitor voltage Vcap to increase with a slope dVcap/dt being determined by I/Cint, i.e. the quotient of charge current I and the capacitance of the internal capacitor (Cint). The increase of the capacitor voltage Vcap continues until first threshold level Vt1=+Vref is reached, e.g. at t1. At that moment t1 the first threshold circuit TC1 supplies a setsignal to the set input SI of the bistable multivibrator BM, upon which the bistable multivibrator BM switches over from a first stable state into a second stable state causing its binary output signal to change from a first value into a second value, e.g. from 0 to 1. As a result thereof the switching device S changes over from the first state into a second state, in which the first current source CS1 is disconnected from the internal capacitor Cint and in which now the second current source CS2 is coupled thereto. The second current source CS2 is supplying decharge current −I to the internal capacitor Cint, causing the capacitor voltage Vcap to decrease with a slope dVcap/dt being determined by −I/Cint from the first threshold level Vt1 to the second threshold level Vt2=−Vref. When at moment t2 the capacitor voltage Vcap reaches the second threshold level Vt2, then the second threshold circuits TC2 of the comparator COM supplies a reset signal to the reset input RI of the bistable multivibrator BM, upon which the bistable multivibrator BM switches over from its second stable state into its first stable state causing its binary output signal to change over from the second value into the first value, e.g. from 1 to 0. The switching device S therewith resumes its first state, in which the first current source CS1 is again coupled to the internal capacitor Cint, whereas now the second current source CS2 is being disconnected therefrom. By deriving the magnitude of the charge/decharge currents and the range between the first and second threshold levels Vt1 and Vt2 in accordance with the invention, from the same parameter, the spread in this parameter has no influence whatsoever on the time period between t1 and t2, i.e. the time necessary for the capacitor voltage Vcap to increase from the second threshold level Vt2 to the first threshold level Vt1, or vice versa, hereinafter also being referred to as time constant tc. According to the invention the magnitude of the charge/decharge currents as well as the first and second threshold levels Vt1 and Vt2 are being derived from a reference voltage Vref supplied by circuitry being part of the planary implemented circuit. The charge/decharge currents I are being derived from Vref by applying Vref across an external resistor Rext (not shown). This allows to use a discrete resistor for Rext, which are commonly available with much less absolute spread than resistors implemented in planary technology. As a result thereof said timeconstant tc mainly depends on the spread in the internal capacitor Cint, the more so if a precision resistor is used for Rext. The spread in the internal capacitor Cint is therewith reflected in the spread of the oscillating frequency of the circuit, i.e. the repetition frequency of the binary output signal b of the bistable multivibrator BM. This repetition frequency is measured in frequency measuring means FM being coupled to the output of the bistable multivibrator BM, by comparing the same with a reference frequency supplied by a crystal oscillator XO. The frequency measuring means FM supplies at an output FMO thereof a signal presenting the spread in the internal capacitor Cint. FIG. 3 shows a circuitdiagram of a preferred embodiment of a circuit for measuring absolute spread in capacitors implemented in planary technology according to the invention, comprising said internal capacitor (Cint) being coupled between emitters of first and second transistors T1 and T2, the collectors and the bases of T1 and T2 being coupled through mutually equal load resistors R to a first supply voltage Vs. The emitters of T1 and T2 are being coupled to first and second outputs of a charge pump. The collectors of T1 and T2 are being coupled to inputs of a negative feedback circuit for a negative feedback of the collector output voltage of T1 and T2 to their base inputs thereof.

The negative feedback circuit also includes third and fourth transistors T3 and T4 having bases coupled to the collectors of said first and second transistors T1 and T2, respectively. The collectors of T3 and T4 are coupled to the supply voltage Vs and the emitters thereof through mutually equal resistors R2 to a second supply voltage, or mass. The emitters of T3 and T4 are respectively coupled to bases of fifth and sixth emitter coupled transistors T5 and T6 respectively, the collectors of T5 and T6 being cross coupled to the bases of the second and first transistors T1 and T2. The emitters of T5 and T6 are commonly coupled to a third output of the charge pump.

The charge pump comprises a pair of emitter coupled seventh and eighth transistors T7 and T8, respectively, the collectors thereof constituting respectively said first and second outputs of the charge pump, the bases thereof being mutually coupled to a reference voltage Vref, and the emitters thereof being coupled through an external resistor (Rext) to mass. The charge pump also comprises a ninth transistor T9, the collector thereof constituting said third output of the charge pump, the base thereof being coupled to the reference voltage Vref and the emitter thereof being coupled to an emitter resistor R to mass. The reference voltage Vref is derived from a serial connection of a resistor Rx with a number of (e.g. 2) diodes D1 and D2 coupled between the supply voltage Vs and mass and available at the common connection of the resistor Rx with the diode D1.

The circuit shown in this FIG. 3 provides the functions of the circuit of FIG. 1 and includes the derivation of the reference voltage Vref as well. In this circuit all elements with exception of Rext and the frequency measuring means FM are being implemented in planary technology on one and the same physical unit, e.g. monolithically integrated in one chip, implemented in thick or thin film technology on one film or in printed circuit board technology on one board.

This allows for accurate element matching, due to the small relative spread in the component values of the elements within the circuit. Therefore the use of mutually identical elements in the implementation of the various functions is optimised. The transistors T1–T9 are mutually identical. Also the resistors R are mutually identical, as are the resistors R2 and respectively the resistors R3. The matching obtained by the use of mutually identical transistors T1–T9 and resistors causes the voltage drop across the external resistor Rext and the emitter resistor of T9 to be mutually substantially equal, this voltage drop being hereinafter referred to as Vref. The charge pump output currents I at the collectors of T7 and T8 are therewith mutually equal and are being substantially determined by Vref and the external resistor Rext, I=Vref/(2*Rext). Rext is chosen substantially equal to R. The threshold levels Vt1 and Vt2 defining the switching moments of the bistable multivibrator, are determined by the voltage across the resistors R connected to the bases of T1 and T2 respectively, this voltage being also equal to Vref. The range between the threshold levels Vt1 and Vt2 therewith corresponds to 2*Vref.

Starting from a first state of the pair of first and second transistors T1 and T2, in which T1 is in a conducting mode, whereas T2 is in a blocking mode, the collector current of T7 is bypassed through T1 to the supply voltage Vs, whereas the collector current of T8 charges the internal capacitor (Cint). This causes the capacitor voltage Vcap (the voltage at the emitter of T1 with regard to the voltage at the emitter of T2) to increase with a slope dVcap/dt being equal to I/Cint. The increase of the capacitor voltage Vcap is reversed into a decrease when it reaches a magnitude equal to Vref. At that moment T2 starts to conduct and by the negative feedback through T3–T6, T1 is blocked, therewith bringing the pair of first and second transistors T1 and T2 in a second state, in which the current supply to the internal capacitor (Cint) is reversed with regard to the situation in the first state. This causes the capacitor voltage Vcap to decrease until a value of –Vref is reached, whereupon T1 starts again to conduct, forcing T2 through the negative feedback into the blocking mode.

Now with dVcap/dt=I/Cint, I=Vref/(2*Rext) and the time period between two consecutive switching actions, i.e. the above time constant tc, being defined by 2*Vref/tc=dVcap/dt, it can easily be demonstrated that 1/tc=1/(4*Rext.Cint).

With f being equal to 1/(2*tc) it means that f=1/(8*Rext.Cint) only varies with the spread in Rext and Cint and is not influenced by the spread in Vref.

A further improvement of the already accurate measuring of the element spread can be obtained by the use of stabilisation means for stabilising the emitter voltage of the ninth transistor T9 (not shown).

A circuit for measuring absolute spread in capacitors implemented in planary technology according to the invention should be readily understood from the foregoing description. It should be apparent that various changes may be made in the present invention as shown by way of example in the drawing of FIGS. 1 and 3, without departing from the spirit and scope of the invention.

What is claimed is:

1. A circuit for measuring absolute spread in capacitors implemented in planary technology comprising:
   a charge pump that is configured to supply a charge current to an internal capacitor (Cint),
   a voltage across the internal capacitor (Cint) being coupled through a comparator for comparing said voltage with first and second threshold levels to a bistable multivibrator for reversing the direction of the charge current:
   to charge the internal capacitor (Cint) when said voltage decreases below the second threshold level and
   to decharge the internal capacitor (Cint), when said voltage increases above the first threshold level,
   wherein
   the charge current, as well as a voltage range between said first and second threshold levels, is dependent upon a reference voltage, and
   an output signal of the bistable multivibrator is coupled to a frequency measuring device that is configured to compare a repetition frequency of the output signal with a reference frequency.

2. The circuit of claim 1, wherein
said voltage range is proportional to the reference voltage.

3. The circuit of claim 2, wherein
said internal capacitor (Cint) is coupled between emitters of first and second transistors,
   collectors and bases of the first and second transistors being coupled through mutually equal load resistors to a first supply voltage,
   said collectors being coupled to inputs of a negative feedback circuit for a negative feedback of output voltages of the collectors of said first and second transistors to the base inputs thereof,
   the emitters of said first and second transistors being coupled to first and second outputs of said charge pump.

4. The circuit of claim 1, wherein
the charge current is generated by the reference voltage being provided across an external resistor Rext.

5. The circuit of claim 4, wherein
said internal capacitor (Cint) is coupled between emitters of first and second transistors,
   collectors and bases of the first and second transistors being coupled through mutually equal load resistors to a first supply voltage,
   said collectors being coupled to inputs of a negative feedback circuit for a negative feedback of output voltages of the collectors of said first and second transistors to the base inputs thereof,
   the emitters of said first and second transistors being coupled to first and second outputs of said charge pump.

6. The circuit of claim 5, wherein
a monotonous variation of the voltage across said internal capacitor in the range between first and second threshold levels corresponds to a quotient of the reference voltage and the internal capacitor (Cint),
said range is dependent upon a magnitude of the reference voltage and
said charge current is dependent upon a quotient of the reference voltage and the external resistor (Rext).

7. The circuit of claim 5, wherein
the negative feedback circuit comprises third and fourth transistors having
   bases coupled to the collectors of said first and second transistors,
   collectors coupled to the supply voltage and
   emitters coupled through mutually equal resistors to a second supply voltage as well as to bases of fifth and sixth emitter coupled transistors,
      collectors of the fifth and sixth emitter coupled transistors being cross coupled to the bases of the second and first transistors, and
      emitters of the fifth and sixth emitter coupled transistors being commonly coupled to a third output of the charge pump.

8. The circuit of claim 7, wherein
the charge pump comprises a pair of emitter coupled seventh and eighth transistors,
  collectors of the seventh and eighth transistors providing respectively said first and second outputs of the charge pump,
  bases of the seventh and eighth transistors being mutually coupled to the reference voltage and
  emitters of the seventh and eighth transistors being coupled through said external resistor (Rext) to the second supply voltage, as well as a ninth transistor having:
    a collector that provides said third output of the charge pump,
    a base that is coupled to said reference voltage and
    an emitter that is coupled via an emitter resistor to the second supply voltage.

9. The circuit of claim 8, further including
a stabilizer that is configured to stabilize the emitter voltage of the ninth transistor.

10. The circuit of claim 9, wherein
a monotonous variation of the voltage across said internal capacitor in the range between first and second threshold levels corresponds to a quotient of the reference voltage and the internal capacitor (Cint),
said range is dependent upon a magnitude of the reference voltage and
said charge current is dependent upon a quotient of the reference voltage and the external resistor (Rext).

11. The circuit of claim 10, wherein
said frequency measuring means comprises
  a clock controlled microprocessor that is configured to measure the repetition frequency of the bistable multivibrator output signal.

12. The circuit of claim 1, wherein
said internal capacitor (Cint) is coupled between emitters of first and second transistors,
  collectors and bases of the first and second transistors being coupled through mutually equal load resistors to a first supply voltage,
  said collectors being coupled to inputs of a negative feedback circuit for a negative feedback of output voltages of the collectors of said first and second transistors to the base inputs thereof,
  the emitters of said first and second transistors being coupled to first and second outputs of said charge pump.

13. The circuit of claim 12, wherein
a monotonous variation of the voltage across said internal capacitor in the range between first and second threshold levels corresponds to a quotient of the reference voltage and the internal capacitor (Cint),
said range is dependent upon a magnitude of the reference voltage and
said charge current is dependent upon a quotient of the reference voltage and an external resistor (Rext).

14. The circuit of claim 12, wherein
the negative feedback circuit comprises third and fourth transistors having
  bases coupled to the collectors of said first and second transistors,
  collectors coupled to the supply voltage and
  emitters coupled through mutually equal resistors to a second supply voltage as well as to bases of fifth and sixth emitter coupled transistors,
    collectors of the fifth and sixth emitter coupled transistors being cross coupled to the bases of the second and first transistors, and
    emitters of the fifth and sixth emitter coupled transistors being commonly coupled to a third output of the charge pump.

15. The circuit of claim 14, wherein
the charge pump comprises a pair of emitter coupled seventh and eighth transistors,
  collectors of the seventh and eighth transistors providing respectively said first and second outputs of the charge pump,
  bases of the seventh and eighth transistors being mutually coupled to the reference voltage and
  emitters of the seventh and eighth transistors being coupled through an external resistor (Rext) to the second supply voltage, as well as a ninth transistor having:
    a collector that provides said third output of the charge pump,
    a base that is coupled to said reference voltage and
    an emitter that is coupled via an emitter resistor to the second supply voltage.

16. The circuit of claim 15, wherein
a monotonous variation of the voltage across said internal capacitor in the range between first and second threshold levels corresponds to a quotient of the reference voltage and the internal capacitor (Cint),
said range is dependent upon a magnitude of the reference voltage and
said charge current is dependent upon a quotient of the reference voltage and the external resistor (Rext).

17. The circuit of claim 1, wherein
a monotonous variation of the voltage across said internal capacitor in the range between first and second threshold levels corresponds to a quotient of the reference voltage and the internal capacitor (Cint),
said range is dependent upon a magnitude of the reference voltage and
said charge current is dependent upon a quotient of the reference voltage and an external resistor (Rext).

18. The circuit of claim 1, wherein
said frequency measuring means comprises
  a clock controlled microprocessor that is configured to measure the repetition frequency of the bistable multivibrator output signal.

19. A method of measuring an absolute spread in capacitance of a capacitor, comprising:
applying a charge current to the capacitor to provide thereby a capacitor voltage,
comparing the capacitor voltage to a first threshold level and a second threshold level,
reversing the charge current when the capacitor voltage rises to the first threshold level, thereby discharging the capacitor, and
reversing the charge current when the capacitor voltage falls to the second threshold level, thereby charging the capacitor, and
measuring a frequency of reversals of the charge current.

20. The method of claim 19, further including
providing a reference voltage,
controlling the charge current based on the reference voltage, and
determining the first threshold level and the second threshold level based on the reference voltage.

* * * * *